United States Patent [19]

Himmel et al.

[11] Patent Number: 5,464,652

[45] Date of Patent: Nov. 7, 1995

[54] GREEN CERAMIC VIA METALLIZATION TECHNIQUE

[75] Inventors: Richard P. Himmel, Mission Viejo; Raymond Brown, Fountain Valley, both of Calif.

[73] Assignee: Hughes Aircraft Company, Los Angeles, Calif.

[21] Appl. No.: 178,352

[22] Filed: Jan. 6, 1994

Related U.S. Application Data

[63] Continuation of Ser. No. 978,618, Nov. 19, 1992, abandoned.

[51] Int. Cl.⁶ .................................................. B05D 5/12
[52] U.S. Cl. .................... 427/97; 427/126.1; 427/367
[58] Field of Search ............................... 427/97, 126.1, 427/367

[56] References Cited

U.S. PATENT DOCUMENTS

| | | | |
|---|---|---|---|
| 3,576,669 | 4/1971 | Filip | 427/125 |
| 4,183,137 | 1/1980 | Lomerson | 427/97 |
| 4,301,192 | 11/1981 | Plichta et al. | 427/97 |
| 4,485,129 | 11/1984 | Grünwald et al. | 427/97 |
| 4,802,945 | 2/1989 | Opina | 427/97 |
| 5,308,645 | 5/1994 | Zachman et al. | 427/97 |

*Primary Examiner*—Benjamin Utech
*Attorney, Agent, or Firm*—M. E. Lachman; M. W. Sales; W. K. Denson-Low

[57] ABSTRACT

The present invention provides a method for metallizing vias in co-fired ceramic green tape. A vacuum operated pick and place anvil comprising a porous block is used to pick up conductor balls from a bed. Air pressure is used to create a vacuum which pulls the conductor balls to the porous block. A stencil having openings is placed on a contact surface of the anvil, thereby permitting only one conductor ball to attach to each opening in the stencil. With the conductor balls attached to the anvil, the anvil is lowered onto the green tape. Next the anvil pushes the conductor balls into the tape until the conductor balls break through the opposite side of the tape. The anvil is retracted leaving the conductor balls lodged in the tape. It is possible to provide a green tape with pre-formed vias so that forcing the conductor balls into the tape is a simpler task. The locations of the openings in the stencil determines the location of the vias or must correspond to the vias in a tape having pre-formed vias. If the conductor balls protrude from any surface of the tape, the anvil or similar device can be used to flatten the protrusion.

13 Claims, 1 Drawing Sheet

GREEN CERAMIC VIA METALLIZATION TECHNIQUE

This is a continuation of application Ser. No. 07/978,618, filed Nov. 19, 1992 now abandoned.

BACKGROUND OF THE INVENTION

1. Field of the Invention

The present invention relates to co-fired ceramic structures. More specifically, the present invention relates to displacing conductor balls into a "green" (unfired) ceramic substrate as a method of metallizing vias.

2. Description of the Prior Art and Related Information

As is known in the art, interconnections between adjacent layers in a chip package are usually performed by vias formed into the substrate. Typically, the vias are created by either laser vaporization or by punching. The subsequent metallization step involves screen printing a thick film metal paste on to the substrate, which along the way then fills in the vias.

A drawback with the screen printing process is that it is a relatively slow process and the result is dependent on many sensitive factors. A certain amount of skilled labor is involved, which in turn has a toll on process speed and quality. Correspondingly, the conventional screen printing process is a relatively expensive way to metallize vias.

Conventional silk screen processes often produce poor quality conductive vias because thick film conductive pastes are used. These pastes have variable shrinkage and often cause incomplete or overfilled vias. In the incomplete filling case, where the defect is called a "dimple," an insufficient amount of paste fills in the via and upon heating, the liquified paste sags into the via giving the appearance of a dimple. If too much conductive paste is used to fill the via, wherein the defect is called a "post", aggregated paste builds into a mound that protrudes above the via. In either case, the finished substrate surface is very rough and provides a bad metallization surface for the next layer. Also, because the rough surface is not flat, any wire bonding or attachment of interconnects or surface mount devices becomes difficult. Indeed, as is known in the art, surface smoothness has an effect on good bonds.

Also with prior art silk screen processes, as mentioned above, because the dielectric substrate and the conductor paste each expands and contracts at different rates during processing due to different coefficients of thermal expansion, the variations in expansion/shrink rates cause unevenness in the finished substrate surface. A major part of the variations stems from the organic binder blended in the paste, which burns off during the firing process thereby causing large dimensional shrinkage in the metallized vias. The organic binder is needed to carry the paste through the mesh openings, so it is an integral part of the screen printing process. On the other hand, the present invention utilizes metal spheres and does not require use of the organic binder.

Therefore, a need presently exists for efficiently metallizing vias in a substrate with high quality yields while maintaining low manufacturing costs.

SUMMARY OF THE INVENTION

Therefore, in view of the foregoing, it is an object of the present invention to provide a co-fired ceramic via metallization process with high quality yields. It is another object of the present invention to provide a process that reduces the labor costs for metallizing vias. It is still another object of the present invention to provide an apparatus for loading an anvil with a pattern of conductor balls and for displacing said conductor balls into a green co-fired substrate.

To achieve the foregoing objectives, the present invention provides a method and apparatus of embedding conductor balls into a co-fired substrate. In the preferred embodiment, metal spheres of a particular dimension, that are suitable as conductors, can be purchased from a variety of commercial suppliers known in the art. A mechanism to pick up the metal spheres is required, and the present invention in the preferred embodiment provides a vacuum operated pick and place anvil. The anvil is made from a porous block and a pressure differential is applied to the backside of the porous block to generate the near vacuum. As the anvil is lowered onto a pile of randomly stacked metal spheres, the vacuum and associated pressure differential literally pulls the metal spheres into contact with the porous block.

In order to ensure proper placement of the metal spheres on the anvil and when correspondingly situated in the substrate, the present invention provides a stencil that is applied to the contact side of the anvil. The stencil includes openings the locations of which correspond to the desired substrate positions for the metal spheres. Therefore, with the metal stencil in place covering the contact side of the porous block and when a vacuum is applied, the metal spheres are drawn to the porous block through the openings. Each opening is a predetermined size sufficient to hold a single metal sphere, so that once the opening is filled with a single sphere, no other spheres can be picked up by that opening.

Next, the anvil with the metal spheres attached to the contact surface is transported to a substrate, which in the preferred embodiment is a commercial grade of green ceramic tape. The anvil is lowered onto the substrate and applies pressure to force the metal spheres into the substrate. The substrate is deformed by the metal spheres and material is pushed out of the way. The pressure continues until the metal spheres break through to the opposite side of the substrate. With the metal spheres embedded in the substrate, the low pressure behind the porous block can be removed thereby releasing the metal spheres from the anvil. The anvil is in turn retracted.

In an alternative embodiment, the substrate can be preformed with vias before the metal spheres are introduced to the substrate. This alternative embodiment process is similar to the preferred embodiment process except that the vias are pre-formed in the substrate. Also, there needs to be prior planning so that the locations of the holes in the metal stencil applied to the porous block coincide with the locations of the vias in the pre-formed substrate. That is, there should be proper alignment between the metal spheres as they are held by the anvil and the vias into which they must be displaced.

As mentioned above, unlike conventional screen printing processes, the present invention provides metallized vias that are much more uniform and do not exhibit dimple or post defects. The surface after metallization is smooth so that the next layer can be stacked thereon without any complications. If the metal spheres are not completely flush within the via, a subsequent flattening operation is possible to deform the protruding portion of the metal sphere to ensure that the substrate surface is flat.

An additional advantage of the present invention is that solid metal spheres can be acquired in a more precise composition than thick film paste. Moreover, because the metal spheres do not shrink, except for a minor coefficient of thermal expansion effect, during the firing process, metallized vias according to the present invention process are formed with much better uniformity than was possible with conventional silk screening processes.

Although the previous discussion was limited to metal spheres, clearly embedding other materials in green tape are possible. For example, spheres having a high thermal conductivity may be embedded to form thermal vias or heat sinks; high dielectric constant spheres can be embedded to create capacitors; while ferrite spheres can be embedded in the vias to function as buried inductors or other magnetic devices.

DESCRIPTION OF THE PREFERRED EMBODIMENTS

In the following description, for purposes of explanation and not limitation, specific numbers, dimensions, materials, etc., are set forth in order to provide a thorough understanding of the present invention. It is apparent to one skilled in the art, however, that the present invention may be practiced in other embodiments that depart from the specific embodiments detailed below.

Figure 1:
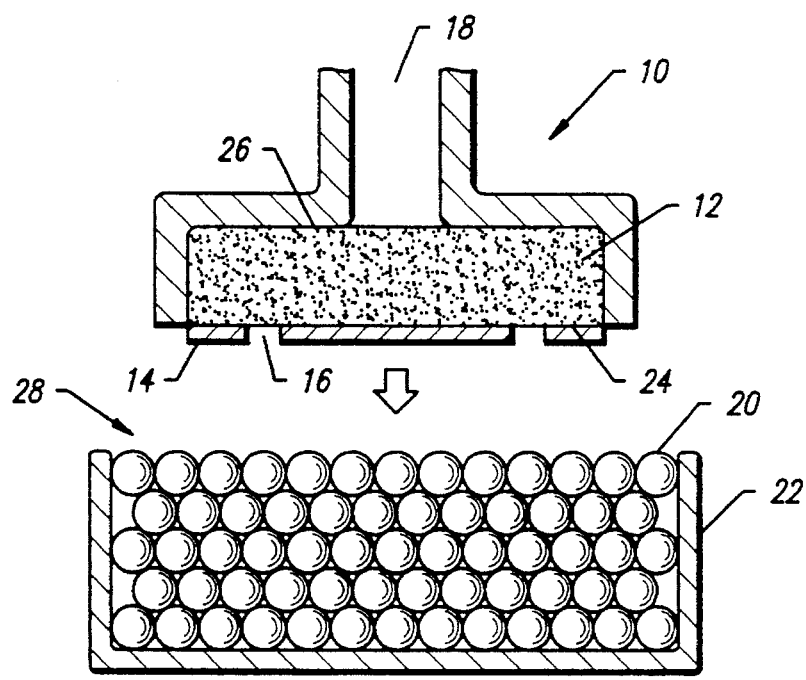
FIG. 1 is a cross-sectional view of a preferred embodiment vacuum pick and place anvil.

In a preferred embodiment, the present invention relates to a method and apparatus for metallizing vias in a green ceramic substrate. FIG. 1 provides a cross-sectional view of a vacuum pick and place anvil preferably used in the present invention. The pneumatically operated anvil 10 is generally comprised of a porous block 12 held inside a housing. On the backside 26 of the porous block 12 is a low pressure region 18 connected to a pump (not shown), known in the art. On the contact side 24 of the porous block 12 is a stencil 14. Within the stencil 14 are openings 16 positioned according to a predetermined arrangement.

It is important to note here that a person skilled in the art, given knowledge of the present disclosure, has the ability to select materials, construct, and practice the present invention. Therefore, the following description is limited to a general overview of the anvil 10 and other structures.

The low pressure region 18 creates a large pressure differential with the ambient environment outside of the anvil 10. Thus air flow occurs from the exterior of the anvil 10 through the openings 16, into the porous block 12, and into the low pressure region 18. In turn, the anvil 10 is lowered onto a bed 28 of conductor balls 20 held inside a container 22. Once the anvil 10 is positioned against the bed 28, the pressure differential draws any conductor ball 20 substantially aligned with the openings 16 therein.

Figure 2:
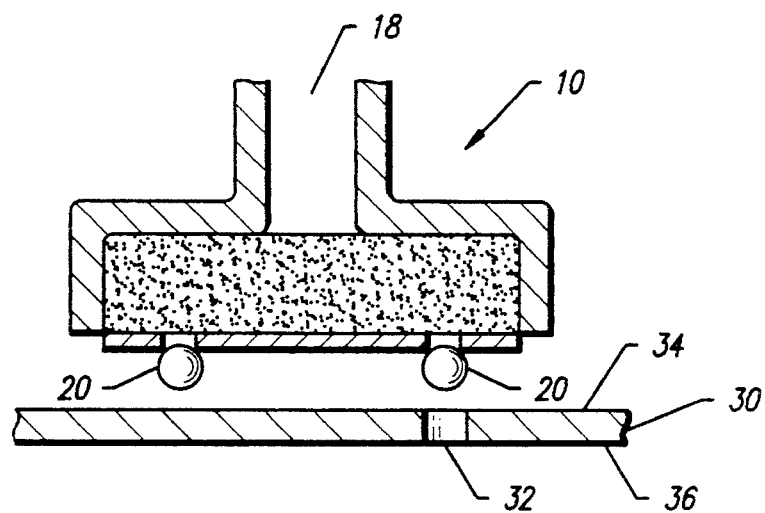
FIG. 2 is a cross-sectional view of the pick and place anvil loading two conductor balls above a co-fired substrate having pre-formed vias.

FIG. 2 illustrates the anvil 10 holding up conductor balls 20 by the vacuum created by the lower pressure region 18. Also, each opening 16 is made to a precise dimension to hold only one conductor ball 20. Thus, conductor balls 20 not specifically drawn to an opening cannot attached to the stencil 14. As a result of using the stencil 14, a precise arrangement of conductor balls 20 become attached to the anvil 10. The other conductor balls 20 remain in the bed 28. Once the openings 16 are filled with individual conductor balls 20, the anvil 10 can be retracted away from the conductor ball bed 28.

In FIG. 2, the anvil 10 is lowered onto a substrate 30, which in the preferred embodiment is a green ceramic tape. The substrate 30 may optionally have a pre-formed via 32 directly aligned beneath each conductor ball 20; or in the preferred embodiment, there is no pre-formed via in the green ceramic tape. To show this, FIG. 2 depicts part of the substrate 30 as not pre-formed and part being pre-formed with a via 32. Obviously, more vias can be incorporated into the substrate, or the substrate can have no vias, than that shown in FIG. 2. In addition, even though the drawing only shows one layer of substrate material, it is possible to stack multiple layers and still employ the present metallizing technique.

In the instance where no pre-formed vias exist in the substrate 30, the process occurs as follows. As the anvil 10 is lowered, the conductor balls 20 are forced through the top surface 34 and become lodged in the substrate 30. The pressure ceases when the conductor balls 20 break through to the opposite side of the substrate 30. The amount of pressure necessary to embed the conductor balls 20 is easily determined by a few test runs.

When the conductor balls 20 are forced through the substrate 30, substrate material previously occupying the same space is displaced and compacted to the sides of the substrate. The action is much like pushing a small metal bead through a stick of chewing gum, wherein most of the displaced material is pushed aside. Some substrate material may be pushed through the thickness of the substrate and fall away out on the opposite side of the substrate.

The utility of the stencil 14 should be apparent. Specifically, the stencil 14 by its pattern of openings 16 determines the relative positions of the conductor balls 20. So when the anvil 10 pushes the conductor balls 20 into the substrate 30, the specific pattern of openings 16 is transferred to the un-pre-formed substrate 30 through the placement of the conductor balls 20.

Likewise, in a substrate 30 pre-formed with vias, the vias are prearranged to be positioned directly beneath each opening 16 of the stencil. When the anvil 10 loaded with conductor balls 20 is lowered, the conductor balls 20 are already aligned with the corresponding pre-formed vias. It is then a matter of pushing the conductor balls 20 into their respective vias.

It is possible to pre-form vias 32 through the substrate 30 by first laser cutting or mechanically punching the substrate 30. Both the laser machining process and the punch and die process are well known in the art and need not be discussed here.

In this alternative embodiment, the prepped substrate 30 already has vias 32 to receive the conductor balls 20 from the anvil 10. Ideally, the diameter of each conductor ball 20 is slightly larger than the diameter of the corresponding via 32. This is so that when the anvil 10 pushes the conductor balls 20 into the vias 32, there is an interference fit between the two structures. Such a precise and tight fit is possible because the conductor balls 20 can be purchased from a commercial supplier to be uniform in size, while the substrate 30 can contain vias 32 having a specific diameter, and are positioned in a predetermined pattern to correspond with the exact locations of the openings 16 in the stencil 14.

Once the conductor balls 20 are firmly lodged in the substrate 30, the low pressure region 18 can be removed, equalizing the pressure inside the anvil 10 with that of the ambient environment. When that happens, the pull on the conductor balls 20 is relaxed and the anvil 10 can be retracted away from the substrate 30.

Figure 3:
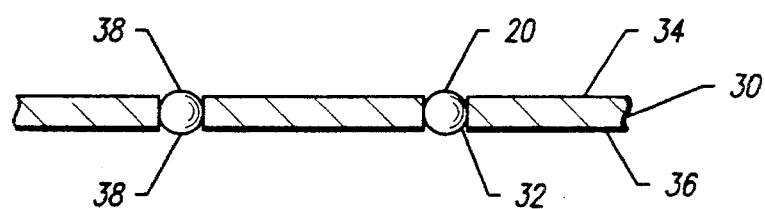
FIG. 3 is a cross-sectional view of the co-fired substrate after the conductor balls have been forced into the vias.
Figure 4:
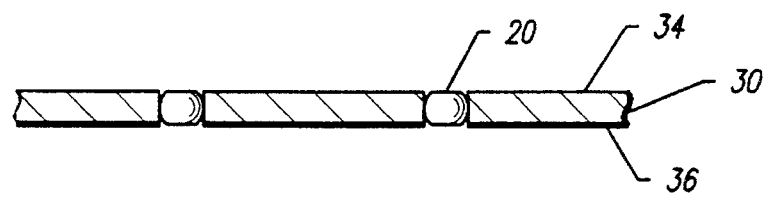
FIG. 4 shows the substrate after the conductor balls have been flattened.

The resulting metallized vias are shown in a cross-sectional view in FIG. 3. The conductor balls 20 as shown in the drawing are snugly disposed in their respective vias 32, and some may protrude slightly through the top surface 34 and the bottom surface 36 of the substrate 30.

In order to provide smooth mounting surfaces 34, 36 for additional layers, the anvil 10 can be used to flatten the protruding areas 38 of the conductor balls 20. To perform the flattening operation, the anvil 10 is first shifted slightly laterally so that the openings 14 in the stencil 14 no longer align with the embedded conductor balls 20. In this manner, only the smooth areas of the preferably metallic anvil 10 are aligned over the embedded conductor balls 20. There is no damage to the porous block 12 during the flattening operation due to the relative strength of the metallic stencil 14, which bears the major part of the stresses. Other means known in the art can be used to flatten the protruding areas 38 of the conductor balls 20. The resulting substrate surface is smooth in comparison to a conventionally metallized surface.

Once the top and bottom surfaces 34 and 36 are smoothed, more layers of green tape can be added thereto. Typically, a stack of seven or eight layers of green tape comprise a complete circuit. To obtain the completed ceramic substrate, the stack is fired and then processed through procedures well-known in the art.

In alternative embodiments, it is possible to substitute the conductor balls 20 with balls having a high thermal conductivity. In that instance, the ball functions as a thermal via or heat sink.

Likewise, the conductor balls can be made from a dielectric material having a high dielectric constant, which dielectric constant is much higher than that of the surrounding substrate. Once embedded in the substrate, and with leads applied to each end, each dielectric ball functions as a self-contained, embedded capacitor. Alternatively, if the balls 20 are formed from a ferrite material and similarly embedded in the substrate with electrical leads connected thereto, they function as buried inductors or like magnetic device.

The conductor balls 20 used in the present invention need not even have a ball shape. As long as they have a pre-formed shape of some design, preferably a shape favoring insertion into a substrate, the result is the same. For instance, the conductor balls can have a cone, ovoid, or teardrop shape that facilitates piercing and then wedging into an unbroken substrate, if no pre-formed via exists. Furthermore, the conductor balls 20 may be hollow spheres.

It is clear that the above-described invention may be embodied in other specific forms without departing from the spirit or essential characteristics of the disclosure. Numerous variations are apparent to a person skilled in the art of via metallization techniques.

What is claimed is:

1. A method of making a filled via in a dielectric substrate comprising the steps of:

(a) providing a green tape dielectric substrate;

(b) providing a solid phase conductor ball; and (c) pushing the conductor ball into the substrate until a via which is filled with the solid conductor ball is formed.

2. A method of making according to claim 1, further comprising step (d) of flattening the conductor ball after the conductor ball is pushed into the substrate.

3. A method of making according to claim 1, wherein the substrate comprises a low temperature co-fireable green ceramic material.

4. A method of making according to claim 1, wherein the conductor ball comprises a thermally conductive material.

5. A method of making according to claim 1, wherein the conductor ball further comprises a metallic sphere.

6. A method of making according to claim 1, wherein the conductor ball further comprises a hollow sphere.

7. A method of making according to claim 1, further comprising the step of positioning the conductor ball according to a location on the substrate wherein the positioning step is accomplished by providing an anvil and using the anvil to position and push the conductor ball into the substrate.

8. A method of making according to claim 7, wherein the anvil is comprised of a porous block, and a vacuum is applied through the porous block to pick up and hold the conductor ball.

9. A method of making according to claim 8, wherein step (c) further comprises pushing the conductor ball into the substrate by using the porous block.

10. A method of making a conductive via in a dielectric substrate comprising the steps of:

(a) providing a dielectric substrate of a low temperature co-fireable green ceramic material;

(b) providing a hollow spherical conductor ball; and (c) pushing the conductor ball into the substrate.

11. A method of making a metallized via in a dielectric substrate comprising the steps of:

(a) providing a dielectric substrate of a low temperature co-fireable green ceramic material;

(b) providing a metal conductor ball;

(c) positioning the conductor ball according to a location on the substrate using an anvil, wherein the anvil is comprised of a porous block and wherein vacuum is applied through the porous block to pick up and hold the conductor ball; and (d) pushing the conductor ball into the substrate at the location.

12. The method of claim 11, wherein step (d) further comprises pushing the conductor ball into the substrate with the porous block.

13. A method of metallizing a dielectric substrate comprising the steps of;

(a) providing a dielectric substrate of a low temperature co-fireable green ceramic material;

(b) forming a via through the dielectric substrate using a punching operation;

(c) providing a solid phase metal conductor ball; and (d) pushing the conductor ball into the via to fill the via with the conductor ball.

* * * * *